United States Patent
Shiraishi et al.

(10) Patent No.: US 12,138,714 B2
(45) Date of Patent: Nov. 12, 2024

(54) FLUX, SOLDER PASTE, SOLDERING PROCESS, METHOD FOR PRODUCING SOLDERED PRODUCT, AND METHOD FOR PRODUCING BGA PACKAGE

(71) Applicants: ORIGIN COMPANY, LIMITED, Saitama (JP); KOKI COMPANY LIMITED, Tokyo (JP)

(72) Inventors: Arisa Shiraishi, Saitama (JP); Naoto Ozawa, Saitama (JP); Takayuki Suzuki, Saitama (JP); Mitsuyasu Furusawa, Tokyo (JP)

(73) Assignees: ORIGIN COMPANY, LIMITED, Saitama (JP); KOKI COMPANY LIMITED, Tokyo (JP)

( * ) Notice: Subject to any disclaimer, the term of this patent is extended or adjusted under 35 U.S.C. 154(b) by 269 days.

(21) Appl. No.: 16/979,165

(22) PCT Filed: Mar. 8, 2019

(86) PCT No.: PCT/JP2019/009284
§ 371 (c)(1),
(2) Date: Sep. 8, 2020

(87) PCT Pub. No.: WO2019/172410
PCT Pub. Date: Sep. 12, 2019

(65) Prior Publication Data
US 2020/0398383 A1    Dec. 24, 2020

(30) Foreign Application Priority Data
Mar. 9, 2018   (JP) .................................. 2018-043396

(51) Int. Cl.
B23K 35/36   (2006.01)
B23K 35/26   (2006.01)
(Continued)

(52) U.S. Cl.
CPC ........ B23K 35/3615 (2013.01); B23K 35/262 (2013.01); B23K 35/362 (2013.01); C22C 13/00 (2013.01); B23K 2101/42 (2018.08)

(58) Field of Classification Search
None
See application file for complete search history.

(56) References Cited

U.S. PATENT DOCUMENTS 5,176,759 A * 1/1993 Taguchi ................. B23K 35/36
                                                    148/23
5,919,317 A * 7/1999 Tanahashi .......... B23K 35/3612
                                                    148/26
(Continued)

FOREIGN PATENT DOCUMENTS

CN       1578713 A *  2/2005  ............ B23K 35/02
JP   2008-221304 A    9/2008
(Continued)

OTHER PUBLICATIONS

Communication dated Oct. 18, 2021 forwarding the extended European Search Report for European Patent Application No. 19764429.7, 9 pages.
(Continued)

*Primary Examiner* — Devang R Patel
(74) *Attorney, Agent, or Firm* — Squire Patton Boggs (US) LLP

(57) ABSTRACT

The flux according to the present invention includes a fatty acid amide; a first solvent having a temperature, at which its mass measured by thermogravimetry at a nitrogen flow rate of 0.2 to 0.3 L per minute and a temperature increase rate of 10° C. per minute becomes zero, of from 180° C. to lower than 260° C.; and a second solvent having a temperature, at which its mass measured by thermogravimetry at a nitrogen flow rate of 0.2 to 0.3 L per minute and a temperature increase rate of 10° C. per minute becomes zero, of from (Continued)

100° C. to lower than 220° C. The flux has a content of the first solvent that is lower than a content of the second solvent. The flux does not include reducing agents for reduction removal of surface oxide films of solder, and does not include activators for improving reducibility.

17 Claims, 7 Drawing Sheets

(51) Int. Cl.
*B23K 35/362* (2006.01)
*C22C 13/00* (2006.01)
*B23K 101/42* (2006.01)

(56) References Cited

U.S. PATENT DOCUMENTS

| | | | | |
|---|---|---|---|---|
| 6,103,549 | A * | 8/2000 | Master | H01L 21/563 |
| | | | | 257/E21.511 |
| 6,468,363 | B2 * | 10/2002 | Henderson | B23K 35/3617 |
| | | | | 148/23 |
| 6,887,319 | B2 * | 5/2005 | Suga | B23K 35/262 |
| | | | | 148/23 |
| 7,767,032 | B2 * | 8/2010 | Sheng | B23K 35/025 |
| | | | | 148/23 |
| 2017/0190005 | A1 | 7/2017 | Uehata et al. | |
| 2018/0200845 | A1 * | 7/2018 | Kawanago | B23K 35/362 |
| 2019/0009375 | A1 * | 1/2019 | Hayashi | B23K 1/20 |

FOREIGN PATENT DOCUMENTS

| | | | | |
|---|---|---|---|---|
| JP | 2015-182125 | A | | 10/2015 |
| JP | 2017064777 | A * | 4/2017 | ........... B23K 35/363 |
| JP | 6160788 | B1 | | 7/2017 |
| JP | 2017-192987 | A | | 10/2017 |
| JP | 6337349 | B1 | | 6/2018 |
| WO | WO 2017/057651 | A1 | | 4/2017 |

OTHER PUBLICATIONS

International Search Report (ISR) for International Application No. PCT/JP2019/009284, dated May 28, 2019, 4 pages total [3 pgs. Original and 1 pg. Translation].

Notice of Reasons for Refusal dated Apr. 4, 2023, issued for Japanese Patent Application No. 2020-505127; with English translation, 13 pages.

* cited by examiner

FLUX, SOLDER PASTE, SOLDERING PROCESS, METHOD FOR PRODUCING SOLDERED PRODUCT, AND METHOD FOR PRODUCING BGA PACKAGE

CROSS-REFERENCE

This application is a National Stage filing under 35 U.S.C. § 371 of International Patent Application No. PCT/JP2019/009284, filed Mar. 8, 2019, which claims the benefit of priority to JP Application No. 2018-043396, filed Mar. 9, 2018, both applications which are incorporated herein by reference in their entirety for all purposes.

TECHNICAL FIELD

The present invention relates to a flux, a solder paste, a soldering process, and a method for producing a soldered product, particularly to a flux capable of configuring a residue-free solder paste, a residue-free solder paste, a soldering process using the solder paste, and methods, using the solder paste, of producing a soldered product and producing a BGA package.

BACKGROUND ART

In the manufacture of a power device, a large area of solder bonding is performed between a semiconductor chip and a DBC (Direct bonded copper) substrate, and between the DBC substrate and a base plate, respectively. As a solder material, a solder foil or solder paste can be used. The former requires a fixture, and the latter requires washing away flux residue after the solder bonding.

Usually, a solder paste includes a solder powder and a flux. Flux components include a reducing agent, an activator, a thixotropic agent (binder), a solvent, and a tackifier resin, for example. The reducing agent has a role of removing oxide films formed on surfaces of the solder powder and soldering targets during soldering, and the activator has a role of improving reducibility and improving wettability of the solder.

However, the flux remains as flux residue after soldering. Among the flux components, the reducing agent and the activator have a significant effect on the soldering performance, corrosion, and migration. As the reduction effect increases, the soldering properties improve. However, these active components are easily ionized and have high affinity with water, and, therefore, tend to cause corrosion and ion migration.

Thus, when a solder paste including a reducing agent or an activator is used, it is necessary to wash away flux residue after solder bonding. However, the process of washing away flux residue increases the cost of the process. Further, the washing process generates waste liquid, which has an adverse environmental impact that demands alleviation.

Patent Document 1 discloses a solder paste that is free of reducing agents and activators and, therefore, does not require washing (paragraph 0001). The flux residue that remains when the solder paste is used is primarily derived from a thixotropic agent included therein, and the amount of flux residue is quite small and is only 1% by mass or less of the entire solder-bonded part.

PRIOR ART DOCUMENT

Patent Literature

Patent Document 1: International Patent Application Publication No. 2017/057651 (WO2017/057651A)

SUMMARY OF INVENTION

Technical Problem

However, even when the above-described solder paste is used, the total amount of flux residue increases as the solder bonding area increases. Further, because the area is large, the flux does not vaporize easily and remains within the solder-bonded part, which can cause generation of voids. It should be noted that a portion in which voids have been produced has poor heat dissipation, which leads to performance degradation of the power device.

In view of the above problems, an object of the present invention is to provide a flux that is free of reducing agents and activators and, in addition, causes an absence of flux residue in the solder-bonded part, thereby causing the solder-bonded part to have a low void content, and to provide a solder paste with the flux. It should be noted that "an absence of flux residue" means that none or little flux residue is present after solder bonding. Specifically, it means that flux residue is present after solder bonding to such a degree that no flux residue can be observed by visual inspection, or some flux residue can be observed by visual inspection but no flux residue can be detected by infrared spectroscopy (IR). The term "low void content" means that voids occupy less than 5% of a soldered part observed with an X-ray transmission device. It should be noted that "%" indicates an area ratio in a two-dimensional transmission image.

Solution to Problem

The present inventors found that, because a fatty acid amide can be evaporated together with evaporation of a certain solvent, when a fatty acid amide as a thixotropic agent and two types of solvents having different temperatures at which their masses measured by thermogravimetry at a nitrogen flow rate of 0.2 to 0.3 L per minute and a temperature increase rate of 10° C. per minute become zero are used to prepare a flux, the flux can be free of reducing agents and activators and includes the two types of solvents (first solvent and second solvent) and the fatty acid amide, and a solder paste using the flux causes an absence of flux residue in the solder-bonded part, resulting in a low void content of the solder-bonded part, and accomplished the present invention.

A flux according to a first aspect of the present invention comprises: a fatty acid amide; a first solvent having a temperature, at which a mass of the first solvent measured by thermogravimetry at a nitrogen flow rate of 0.2 to 0.3 L per minute and a temperature increase rate of 10° C. per minute becomes zero, of from 180° C. to lower than 260° C.; and a second solvent having a temperature, at which a mass of the second solvent measured by thermogravimetry at a nitrogen flow rate of 0.2 to 0.3 L per minute and a temperature increase rate of 10° C. per minute becomes zero, of from 100° C. to lower than 220° C. A content of the first solvent is lower than a content of the second solvent. The flux does not include reducing agents for reduction removal of surface oxide films of solder, and does not include activators for improving reducibility. A mixture of the flux and a solder powder is obtainable as a solder paste and an absence of flux residue is achievable.

In this specification, the expression "a mass measured by thermogravimetry is zero" means a value of zero or a value close to zero, and a value at which the TG curve stops varying even under application of heat (or value at which the TG curve stops showing an observable change even under application of heat). The "fatty acid amide" serves as a thixotropic agent and allows prevention of separation between the solder powder and other components and prevention of sag, for example. The "solvents" allow viscosity adjustment, for example. The second solvent preferably evaporates at a temperature lower than the temperature at which the solder powder melts. The first solvent preferably evaporates the fatty acid amide during its evaporation. The "reducing agent" refers to a component that removes oxide films, and the "activator" refers to a component that improves reducibility. The expression "free of reducing agents" or "not include reducing agents" means including no reducing agent or including a reducing agent, if any, in such an amount that the effect in the present invention is not hindered, and the expression "free of activators" or "not include activators" means including no activator or including an activator, if any, in such an amount that the effect in the present invention is not hindered. In other words, they are present in such an amount as to cause an absence of flux residue that needs to be washed away and enable a solder-bonded part with a low void content to be achieved. As described above, the flux may include other components, such as reducing agents, activators, and additives, to such a degree that the effect in the present invention is not hindered. In other words, the flux in the present invention may be a flux essentially consisting of a first solvent, a second solvent and a fatty acid amide, and the solder paste may be a solder paste essentially consisting of a solder powder, a first solvent, a second solvent and a fatty acid amide. When the expression "consisting of" is used in this specification, it means "consisting essentially of."

With this configuration, it is possible to obtain a flux that causes an absence of flux residue and enables a solder-bonded part with a low void content to be achieved.

A flux according to a second aspect of the present invention is the flux according to the above first aspect of the present invention, in which the temperature of the first solvent is higher than the temperature of the second solvent, and the temperature of the first solvent and the temperature of the second solvent differ by 15° C. or more.

With this configuration, a more preferred combination of the first solvent and the second solvent can be achieved.

A flux according to a third aspect of the present invention is the flux according to the above first or second aspect of the present invention, including 6 to 24% by mass of the fatty acid amide, 2 to 15% by mass of the first solvent, and 70 to 86% by mass of the second solvent.

With this configuration, a more preferred proportion of the flux components can be achieved.

A flux according to a fourth aspect of the present invention is the flux according to any one of the above first to third aspects of the present invention, consisting essentially of: the fatty acid amide; the first solvent; and the second solvent.

With this configuration, it is possible to obtain a flux that causes an absence of flux residue and enables a solder-bonded part with a low void content to be achieved.

A solder paste according to a fifth aspect of the present invention comprises: a solder powder; and the flux according to any one of the above first to fourth aspects.

With this configuration, it is possible to obtain a solder paste that causes an absence of flux residue after solder bonding and enables a solder-bonded part with a low void content to be achieved.

A solder paste according to a sixth aspect of the present invention consists essentially of: a solder powder; and the flux according to the above fourth aspect.

With this configuration, it is possible to obtain a solder paste that causes an absence of flux residue after solder bonding and enables a solder-bonded part with a low void content to be achieved.

A solder paste according to a seventh aspect of the present invention is the solder paste according to the above fifth or sixth aspect of the present invention, in which the solder powder includes powder particles having a particle size of 38 μm or smaller at a ratio of 40% by mass or less based on a total amount of the solder powder.

With this configuration, at least 60% by mass of the solder powder has a particle size greater than 38 μm, and gaps more suitable for introduction of a reducing gas can be maintained between solder powder particles, allowing easier penetration of the reducing gas. In addition, as the spaces between particles are larger if the particle size is larger, the solvents and the fatty acid amide evaporate more easily. Particularly, in a power device with a large bonded area, the above-described particle size is more preferred because it is difficult to evaporate the solvents and the fatty acid amide in its central portion. It should be noted that an example of a scanning electron microscope (SEM) image of gaps formed between solder powder particles is shown in FIG. 7.

A soldering process according to an eighth aspect of the present invention comprises: providing the solder paste according to any one of the above fifth to seventh aspects; introducing a reducing gas configured to reduce the solder powder; and melting the solder powder.

With this configuration, the flux residue can be reduced to zero. In addition, because the solder paste is free of reducing agents and activators, the volatile matter emitted from the flux during soldering therefore has no ionicity causing corrosion of the substrate and other members.

A method for producing a soldered product according to a ninth aspect of the present invention comprises:

applying a solder paste to a soldering target, the solder paste including: a solder powder, a fatty acid amide, a first solvent, and a second solvent having a temperature, at which a mass of the second solvent measured by thermogravimetry at a nitrogen flow rate of 0.2 to 0.3 L per minute and a temperature increase rate of 10° C. per minute becomes zero, that is lower than a corresponding temperature of the first solvent;

evaporating the second solvent by heating the soldering target with the solder paste applied thereto at a temperature in a range in which the solder powder does not melt;

concurrently with or after evaporating the second solvent, reducing the solder powder and the soldering target with a reducing gas; and after reducing the solder powder, melting the solder powder by heating the solder powder and the soldering target.

The first solvent and the fatty acid amide evaporate together with the second solvent in the evaporating or evaporate as a result of the heating in the melting, whereby an absence of flux residue is achievable.

With this configuration, the solder powder does not melt during reduction, and the gaps formed between the solder powder particles and so on allows effective reduction of the solder powder and the soldering target. In addition, it is possible to provide a method for producing a soldered product having an advantage that, because the flux residue can be reduced to zero and the solder paste is free of reducing agents and activators, the volatile matter emitted from the flux during soldering therefore has no ionicity that causes corrosion of the substrate and other members.

A method for producing a soldered product according to a tenth aspect of the present invention is the method for producing a soldered product according to the above ninth aspect, in which the evaporating comprises reducing a pressure in a space in which the soldering target is placed.

With this configuration, it is possible to accelerate evaporation of flux components that evaporate during the evaporation step.

A method for producing a soldered product according to an eleventh aspect of the present invention is the method for producing a soldered product according to the above ninth or tenth aspect, in which, in the evaporating, the soldering target is heated in a vacuum. The term "vacuum" refers to a space having a pressure lower than the atmospheric pressure (so-called reduced pressure).

With this configuration, evaporation of the solvent can be accelerated. In addition, because even a solvent having a boiling point that is higher than the reduction temperature under normal pressure can be evaporated efficiently, the types of usable solvents can be increased.

A method for producing a soldered product according to a twelfth aspect of the present invention is the method for producing a soldered product according to any one of the above ninth to eleventh aspects, in which gaps are formed between the solder powder particles by the evaporating, and, in the reducing, the reducing gas is introduced into the gaps in a state in which the solder powder and the soldering target are disposed in a vacuum.

With this configuration, penetration of the reducing gas into gaps between the solder powder particles and so on can be facilitated.

A method for producing a soldered product according to a thirteenth aspect of the present invention is the method for producing a soldered product according to any one of the above ninth to twelfth aspects, in which melting the solder powder is carried out by heating the solder powder and the soldering target in a vacuum to obtain an integrated solder-bonded part, the method further comprising: after melting the solder powder, rupturing the vacuum to compress and eliminate internal cavities and voids in the solder-bonded part; and after rupturing the vacuum, cooling the soldering target.

With this configuration, the cavities (or voids) can be squashed while the solder is in a molten state in the vacuum rupturing step and the solder can be solidified after the cavities are squashed. Thus, the decrease in fatigue life caused by voids in the solder can be further restrained.

A method for producing a soldered product according to a fourteenth aspect of the present invention is the method for producing a soldered product according to any one of the above ninth to thirteenth aspects, in which the reducing gas comprises a formic acid gas.

With this configuration, a solder paste suitable for a gas frequently used as a reducing gas can be obtained. In addition, the solder powder and the soldering target can be reduced at a temperature lower than 300° C.

A fifteenth aspect of the present invention is a method for producing a BGA package using a flux according to any one of the first to fourth aspects of the present invention as a temporal fixative for a solder ball. The method for producing a BGA package includes:

applying a flux to a BGA package substrate as a temporal fixative, the flux including: a fatty acid amide, a first solvent, and a second solvent having a temperature, at which a mass of the second solvent measured by thermogravimetry at a nitrogen flow rate of 0.2 to 0.3 L per minute and a temperature increase rate of 10° C. per minute becomes zero, that is lower than a corresponding temperature of the first solvent;

temporally fixing solder balls on the applied flux;

evaporating the second solvent by heating the BGA package substrate with the flux applied thereto at a temperature in a range in which the solder balls do not melt;

concurrently with or after evaporating the second solvent, reducing the solder balls and the BGA package substrate with a reducing gas; and after reducing the solder balls, forming solder bumps by heating the solder balls and the BGA package substrate to bond the solder balls to the BGA package substrate.

The first solvent and the fatty acid amide evaporate together with the second solvent in the evaporating or evaporate as a result of the heating in the forming, whereby an absence of flux residue is achievable.

With this configuration, it is possible to cause an absence of flux residue and produce a BGA package having a solder-bonded part with a low void content.

A method for producing a soldered product according to a sixteenth aspect of the present invention includes:

applying a solder paste to a soldering target, the solder paste including: a solder powder, a fatty acid amide, a first solvent, and a second solvent having a temperature, at which a mass of the second solvent measured by thermogravimetry at a nitrogen flow rate of 0.2 to 0.3 L per minute and a temperature increase rate of 10° C. per minute becomes zero, that is lower than a corresponding temperature of the first solvent;

placing solder bumps of a BGA package on the applied solder paste;

evaporating the second solvent by heating the soldering target with the solder paste applied thereto at a temperature in a range in which the solder powder and the solder bumps do not melt;

concurrently with or after evaporating the second solvent, reducing the solder powder, the soldering target and the solder bumps with a reducing gas; and after reducing the solder powder, melting the solder powder and the solder bumps by heating the solder powder, the soldering target and the solder bumps.

The first solvent and the fatty acid amide evaporate together with the second solvent in the evaporating or evaporate as a result of heating the solder powder when melting the solder powder, whereby an absence of flux residue is achievable.

With this configuration, when the soldering target is a printed-circuit board, a BGA package can be mounted thereon. Further, it is possible to cause an absence of flux residue and achieve a solder-bonded part with a low void content.

Advantageous Effects of Invention

According to the present invention, it is possible to obtain a flux that is free of reducing agents and activators and that causes an absence of flux residue that needs to be washed away and enables a solder-bonded part with a low void content to be achieved. Further, a mixture of the flux and a solder powder can produce a solder paste that causes an absence of flux residue that needs to be washed away and enables a solder-bonded part with a low void content to be achieved.

BRIEF DESCRIPTION OF DRAWINGS

FIG. 1A shows a conventional method and FIG. 1B shows a method according to the present invention.

DESCRIPTION OF EMBODIMENTS

Figure 1:
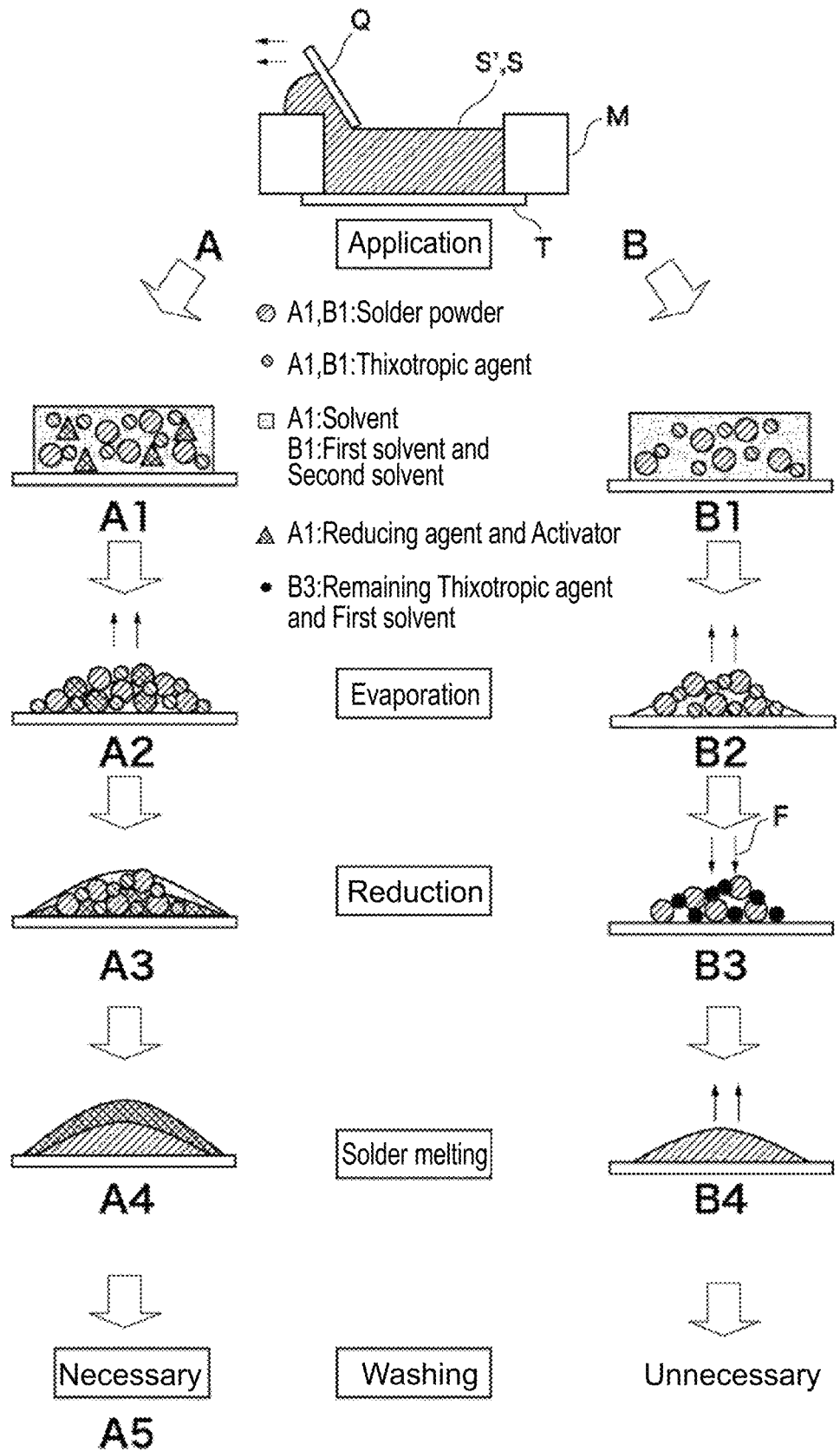
FIG. 1 shows overviews of methods for producing a soldered product.

This application is based on Japanese Patent Application No. 2018-043396, filed on Mar. 9, 2018 in Japan, the contents of which are hereby incorporated in its entirety by reference into the present application, as part thereof.

Further, the present invention will become more fully understood from the detailed description given hereinbelow. Further applicable range in the present invention will become apparent from the detailed description given hereinbelow. However, the detailed description and the specific embodiment are illustrated of desired embodiments of the present invention and are described only for the purpose of explanation. Various changes and modifications will be apparent to those ordinary skilled in the art within the spirit and scope of the present invention on the basis of the detailed description. The applicant has no intention to give to public any disclosed embodiment. Among the changes and modifications, those which may not literally fall within the scope of the claims constitute, therefore, part of the present invention in the sense of doctrine of equivalents.

Description will hereinafter be made of an embodiment of the present invention with reference to the drawings. The same or corresponding members are denoted with the same or similar reference numerals or symbols in all the drawings, and their descriptions are not repeated. Further, the present invention is not limited to the following embodiments.

Flux

A flux according to a first embodiment of the present invention is described.

The flux in the present invention includes a fatty acid amide as a thixotropic agent and first and second solvents, which are two types of solvents having different temperatures at which their masses measured by thermogravimetry at a nitrogen flow rate of 0.2 to 0.3 L per minute and a temperature increase rate of 10° C. per minute become zero, but is free of reducing agents and activators. Even if the flux includes a reducing agent or an activator, its amount is up to an extent that the effects in the present invention are not hindered.

Here, a reducing agent is a substance that exhibits a reducing action and removes oxide films on surfaces of the solder powder and of the soldering targets during soldering. The reducing agent includes rosin and rosin derivatives, for example.

An activator is a substance that improves reducibility and improves wettability of the solder. The activator includes amine-hydrohalic acid salts and organic acids, for example. The amine-hydrohalic acid salts include diethylamine hydrobromides and cyclohexylamine hydrobromides, for example. The organic acids include glutaric acid, adipic acid, azelaic acid, sebacic acid, stearic acid, and benzoic acid, for example.

It should be noted that the flux in the present invention may include compounds (additives or the like) other than the fatty acid amide and the solvents except for a reducing agent and an activator as long as the effect in the invention can be achieved.

Solder Paste

A solder paste according to a second embodiment of the present invention is described.

The solder paste in the present invention includes a flux as described above and a solder powder.

It should be noted that the solder paste in the present invention may include compounds (additives or the like) other than a flux and a solder powder as described above except for a reducing agent and an activator as long as the effect in the invention can be achieved.

When soldering is carried out using the solder paste in the present invention, a reducing gas is used for reduction. Preferably, the solder powder included in the solder paste in the present invention does not melt at the reduction temperature with the reducing gas and the gas pressure during reduction. In other words, the melting temperature of the solder powder is any temperature higher than the reduction temperature, and is preferably 10 to 50° C. higher than the reduction temperature in this embodiment.

Solvent

The second solvent preferably evaporates (vaporizes) at a temperature equal to or lower than the reduction temperature. The lowest temperature at which evaporation of the second solvent is completed regardless of the gas pressure (which is hereinafter referred to as "evaporation temperature") is any temperature equal to or lower than the reduction temperature. A mechanism for adjusting the pressure of atmosphere enables a solvent that has a boiling point higher than the reduction temperature under normal pressure to evaporate at a temperature lower than the reduction temperature and enables the solvent to be used as a second solvent. As described above, the second solvent needed to evaporate at a temperature equal to or lower than the reduction temperature under a predetermined gas pressure.

In other words, the flux and the solder paste in the present invention include materials having the following relationship under a predetermined gas pressure:

Evaporation temperature of second solvent≤Reduction temperature<Melting point of solder powder The "melting point" above refers to the temperature at which the substance melts regardless of the gas pressure.

As described above, the solder powder is needed to be solid and the second solvent needed to be gaseous during the reduction with the reducing gas, and the solder powder and the second solvent can be combined as appropriate depending on the temperature at reduction.

The first solvent may be a solvent that starts evaporating together with evaporation of the second solvent at a temperature lower than its inherent boiling point and evaporates (vaporizes) completely together with the second solvent in the evaporation step, or a solvent that evaporates with a temperature increase from the temperature at reduction in contrast to the second solvent. As described above, the first solvent may disappear by evaporation at different times depending on its type. It should be noted that because it is necessary to evaporate the fatty acid amide together with evaporation of the first solvent, the first solvent preferably can evaporate the fatty acid amide during its evaporation.

The first solvent preferably has a temperature at which its mass measured by thermogravimetry at a nitrogen flow rate of 0.2 to 0.3 L per minute and a temperature increase rate of 10° C. per minute becomes zero, the temperature being 180° C. or higher and lower than 260° C.

The second solvent preferably has a temperature at which its mass measured by thermogravimetry at a nitrogen flow rate of 0.2 to 0.3 L per minute and a temperature increase rate of 10° C. per minute becomes zero, the temperature being 100° C. or higher and lower than 220° C.

The thermogravimetry (TG) was performed on around 5 mg (approximately 5 mg) of sample placed in an aluminum pan with a thermal analyzer (TG-DTA) TG8120 manufactured by Rigaku Corporation.

The difference between the temperature of the first solvent and the temperature of the second solvent is preferably at least 15° C. or higher. More preferably, the difference is 25° C. or higher, especially preferably 35° C. or higher.

The first solvent can include tetraethylene glycol dimethyl ether, diethylene glycol monophenyl ether, 1-hexadecanol, 2-hexyldecanol, 1-octadecanol, isoarachyl alcohol, isooctadecanol, trimethylol propane, triethylene glycol, tetraethylene glycol, 1,8-octanediol, and 2,4-diethyl-1,5-pentanediol, for example. The above solvents may be used singly or in combination of two or more kinds.

The second solvent can include glycol-based solvents, glycol ether-based solvents, and alcohol-based solvents, for example, more specifically, include triethylene glycol monomethyl ether, triethylene glycol dimethyl ether, diethylene glycol monomethyl ether, diethylene glycol monobutyl ether, diethylene glycol monohexyl ether, ethylene glycol monophenyl ether, diethylene glycol monobutyl acetate, dipropylene glycol, diethylene glycol-2-ethylhexyl ether, α-terpineol, menthol, benzyl alcohol, 2-ethyl-1,3-hexanediol, 2,2,4-trimethyl-1,3-pentanediol, 2,5-dimethyl-2,5-hexanediol, 2-methylpentane-2,4-diol, 2,2-dimethyl-1,3-propanediol, butyl benzoate, diethyl adipate, dodecane, tetradecene, ethylene glycol, diethylene glycol, hexylene glycol, 1,5-dihydroxypentane, and oleyl alcohol, for example. The above solvents may be used singly or in combination of two or more kinds.

Thixotropic Agent

The thixotropic agent adjusts the viscosity of the solder paste or promotes adherence of substances. A fatty acid amide is used as the thixotropic agent.

The fatty acid amide can include amide-based thixotropic agents. The amide-based thixotropic agent is a compound having an amide bond (—CONH—), and can include: higher fatty acid amides such as stearic acid amide, palmitic acid amide, lauric acid amide, behenic acid amide and 12-hydroxystearic acid amide; unsaturated fatty acid monoamides such as ricinoleic acid amide, erucic acid amide and oleic acid amide; substituted amides such as N-lauryl lauric acid amide and N-stearyl stearic acid amide; methylol amides such as methylol stearic acid amide; ethylene oxide adducts of fatty acid amides; fatty acid ester amides; fatty acid ethanol amides; substituted ureas such as N-butyl-N'-stearyl urea; saturated fatty acid bisamides such as methylenebis stearic acid amide, ethylenebis lauric acid amide and ethylenebis hydroxystearic acid amide; unsaturated fatty acid bisamides such as methylenebis oleic acid amide; and aromatic bisamides such as m-xylylene bis-stearic acid amide. These amide-based thixotropic agents may be used singly or in combination of two or more kinds.

It should be noted that the thixotropic agent may be in any form, and may be granular or flaky. Further, the thixotropic agent swollen with a solvent may be used. Among the above thixotropic agents, the use of a higher fatty acid amide or the like is more preferred because it volatilizes easily together with the first solvent. Especially preferred are higher fatty acid amides and unsaturated fatty acid amides having a melting point of 80° C. or higher and 110° C. or lower at normal pressure.

These thixotropic agents enable the flux and the solder paste to have an increased viscosity, enable the solder paste to have an increased thixotropic ratio (improved printability) and improved heat sag properties, and can prevent separation between the solder powder and the flux. These thixotropic agents evaporate when the first solvent evaporates and therefore hardly remain in a solder-bonded part. Even when the thixotropic agents adhere again to the substrate or parts after volatilization, the thixotropic agents do not cause corrosion thereof because they are not active substances.

Solder Powder

The alloy composition of the solder powder is not particularly limited. Various types of solder alloys presently used in bump formation or mounting on printed-circuit boards can be used. The solder alloy can include powders of lead-free solder alloys used as lead-free solders, such as Sn—Ag solder, Sn—Ag—Cu solder, Sn—Ag—Cu—Bi solder, Sn—Ag—In—Bi solder, Sn—Cu solder, Sn—Zn solder and Sn—Bi solder, and a variable melting point alloy A-FAP.

Figure 7:
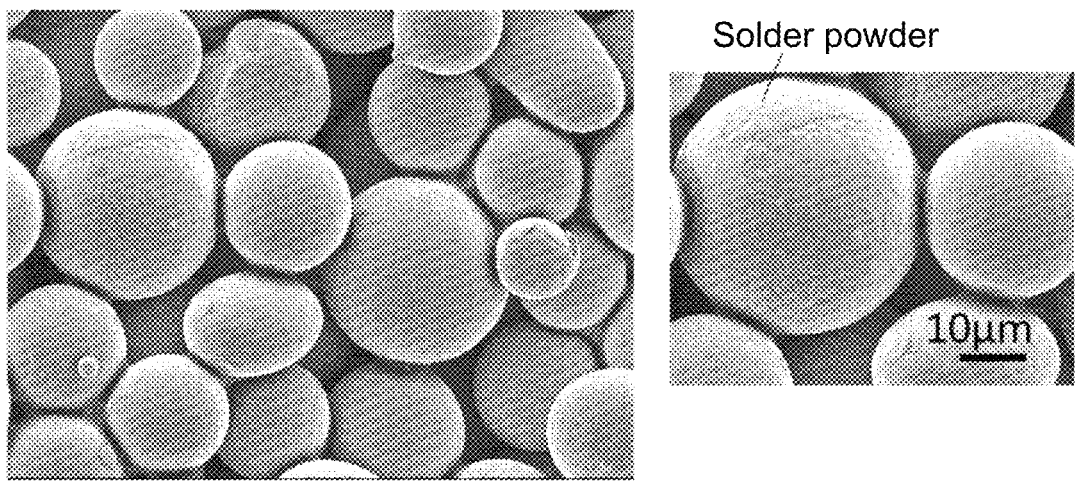
FIG. 7 shows a scanning electron microscope (SEM) image, showing gaps formed between solder powder particles.

The solder powder can have an average particle size in the range of 15 to 53 μm or 20 to 53 μm, for example. However, a solder powder having a larger or smaller diameter may be used as appropriate depending on the size of the printing opening. It should be noted that, in view of introducing a reducing gas into gaps between solder powder particles to improve reducibility, the solder powder more preferably includes particles with a particle size of 38 μm or smaller at a ratio of 40% by mass or less based on the total amount of the solder powder. Still more preferably, the ratio is 30% by mass or less, particularly preferably 20% by mass or less. An example of gaps formed between solder powders resulting from differences in particle size is shown by a scanning electron microscope (SEM) image in FIG. 7.

The term "average particle size" as used herein means the particle size at a cumulative value of 50% in the particle size distribution obtained by a laser diffraction/scattering method.

Reducing Gas

The reducing gas used together with the solder paste can include hydrogen, gases of carboxylic acids such as formic acid, gases of organic acids other than carboxylic acids, gases of organic compounds other than organic acids, and other reductive gases other than organic compounds.

The temperature at reduction is preferably 150 to 450° C. regardless of whether the reduction is carried out at normal pressure or under vacuum. For example, when the reducing gas is formic acid, the reduction temperature is 150 to 300° C., preferably 160 to 250° C., more preferably 170 to 230° C. When the reducing gas is hydrogen, the reduction temperature is 250 to 450° C., preferably 260 to 400° C., more preferably 270 to 350° C.

As one example, when formic acid is used as the reducing gas and the reduction temperature is about 200° C., the use of a solvent that evaporates at about 200° C. or lower as the second solvent is preferred. The use of formic acid is preferred because formic acid enables reduction to be carried out at a lower temperature compared to other reducing gases.

Composition

The flux in the present invention can be composed of 6 to 24% by mass of a fatty acid amide, 2 to 15% by mass of a first solvent and 70 to 86% by mass of a second solvent, preferably, of 9 to 15% by mass of a fatty acid amide, 4 to 12% by mass of a first solvent and 76 to 84% by mass of a second solvent. For example, the flux is composed of 4% by mass of a first solvent, 12% by mass of a fatty acid amide and 84% by mass of a second solvent.

The solder paste in the present invention can be composed of 80 to 99% by mass of a solder powder and 1 to 20% by mass of the above flux, preferably, of 85 to 95% by mass of a solder powder and 5 to 15% by mass of the above flux.

The flux in the present invention is typically obtained by mixing the fatty acid amide, the first solvent and the second solvent at the above ratio. The solder paste in the present invention is typically obtained by mixing the solder powder, the fatty acid amid, the first solvent and the second solvent at the above ratio to form a paste. The amounts of the fatty acid amide and the solvents may be changed as appropriate depending on the degree of viscosity adjustment. The fatty acid amide and the solvents can be mixed by stirring while heating. The mixing with the solder powder can be achieved by using a stirrer at normal temperature.

Method for Producing Soldered Product

Referring to FIG. 1, a method for producing a soldered product according to a third embodiment of the present invention is outlined in comparison with a conventional method. A method A in FIG. 1 is a conventional method, and the solder paste used includes a solder powder, and includes a reducing agent, an activator, a thixotropic agent, and a solvent as a flux. A method B is the method for producing a soldered product in the present invention, and the solder paste used includes a solder powder, and includes a thixotropic agent (fatty acid amide), a first solvent and a second solvent as a flux but includes no reducing agent and no activator.

In the following, description is made using a soldering target T and a solder paste S as members to be bonded in FIG. 1.

First, in the method A, a solder paste S' is applied to the soldering target T by screen printing or the like (A1). When the soldering target T and the solder paste S' shown in FIG. 1 are heated, the solvent starts to evaporate (A2). Heating is further continued to induce reduction by a molten flux including the reducing agent and the activator (A3). Heating is further continued to the solder melting temperature or higher to achieve soldering (A4). Because approximately 10% by mass of the flux in the solder paste remains as flux residue, washing is carried out to remove the flux residue (A5).

On the other hand, in the method B, the solder paste S is applied to the soldering target T by screen printing or the like (B1). When the soldering target T and the solder paste S shown in FIG. 1 are heated, the second solvent starts to evaporate (B2). Heating is further continued to the reduction temperature to induce reduction by a reducing gas F (B3). The fatty acid amide as a thixotropic agent and the first solvent may still remain in the reduction (B3) depending on various conditions such as the type of the first solvent and the time before the reduction is started. Then, heating is further continued to the solder melting temperature or higher to achieve soldering (B4). When the first solvent remains, the first solvent evaporates before the soldering is completed, and the fatty acid amide as a thixotropic agent also evaporates together with the evaporation of the first solvent. Thus, little flux residue remains and washing is naturally unnecessary. In the method B, because the temperature at which the solder powder melts is higher than the reduction temperature, the solder powder cannot melt during reduction. Thus, gaps are formed between the solder powder particles and facilitate penetration of the reducing gas and the reduction by the reducing gas. It should be noted that the reduction may occur either simultaneously with or after the evaporation of the second solvent.

Figure 2:
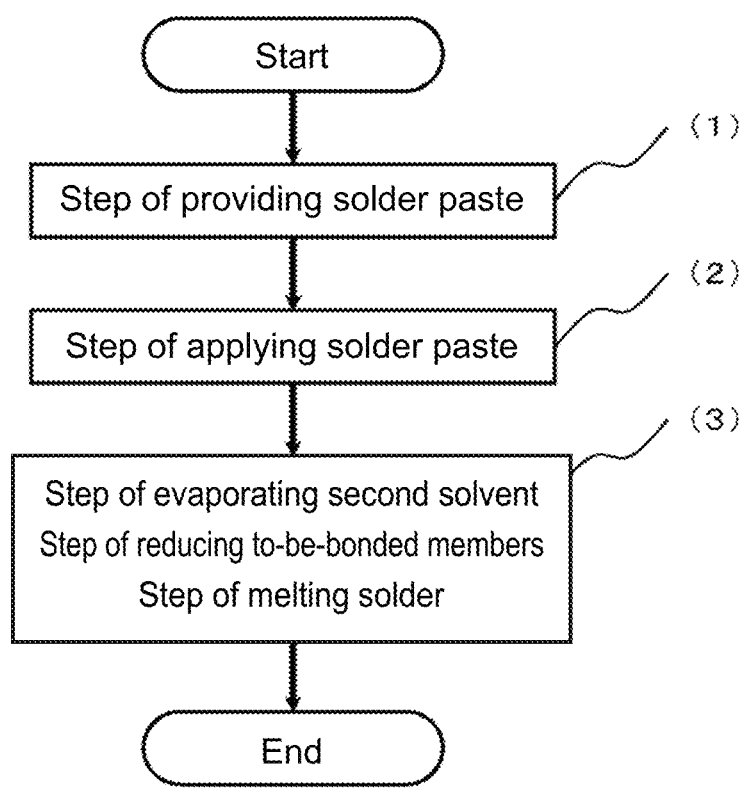
FIG. 2 shows a flowchart of a method for producing a soldered product according to the present invention.

Referring to FIG. 2, the method for producing a soldered product according to a third embodiment of the present invention is described in more detail. FIG. 2 is a flowchart showing the method for producing a soldered product.

Figure 3:
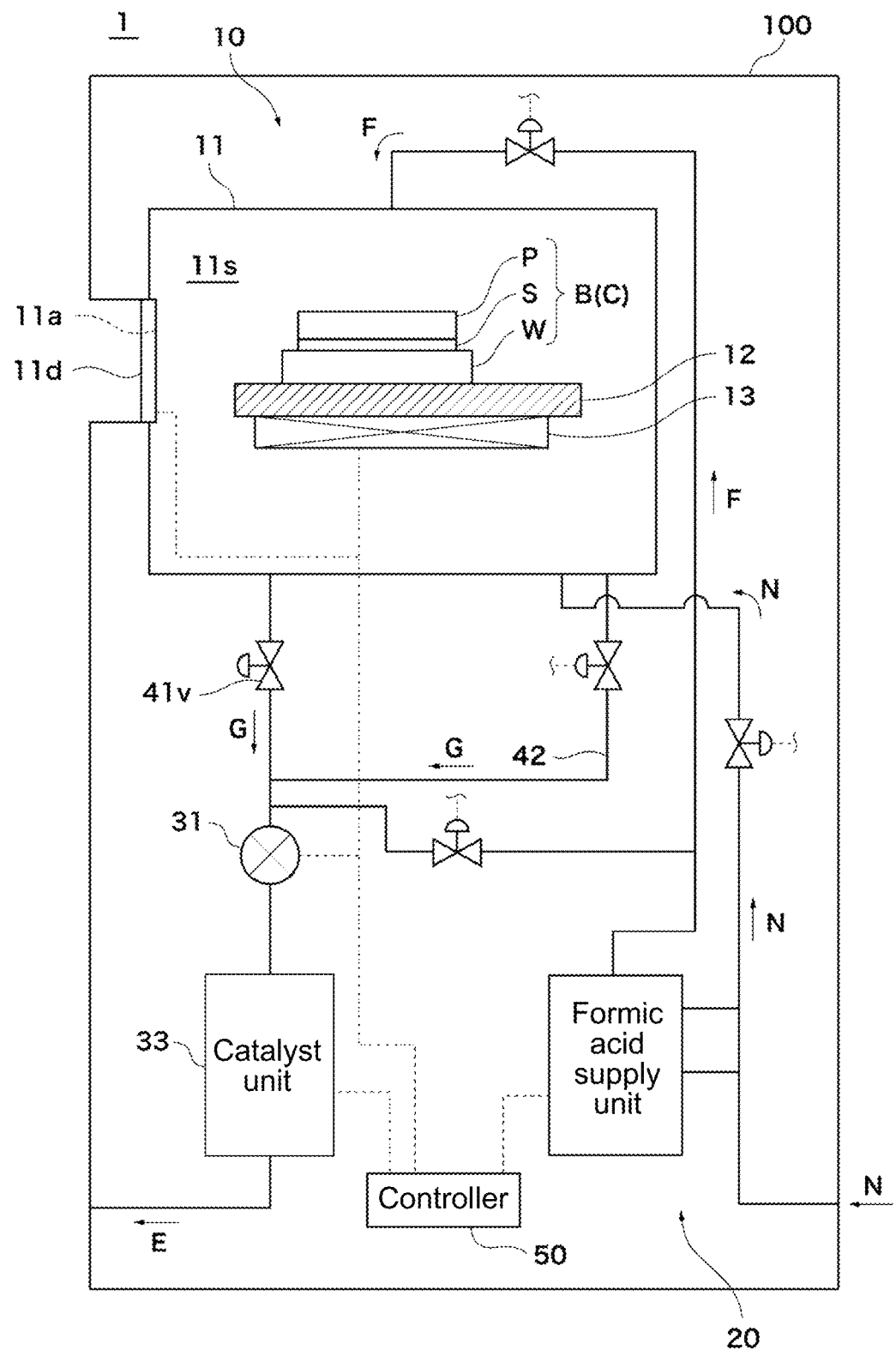
FIG. 3 shows a general configuration diagram of a soldering apparatus 1.

In the following, description is made in FIGS. 2 and 3 using a substrate W, a solder paste S and an electronic component P as members to be bonded as shown in FIG. 3.

(1) Step of Providing Solder Paste

A step of providing a solder paste is a step of bringing the above solder paste according to a second embodiment of the present invention into a usable state. This may be the production of the solder paste or the preparation of an already produced solder paste.

(2) Step of Applying Solder Paste

The solder paste is applied to a soldering target with a solder paste printer (or screen printer) or the like. Usually, printing is carried out using a mask (pattern) of a perforated metal plate with a thickness of about 30 to 300 μm called metal mask, for example, and a squeegee of the printer. A manual apparatus having a manually operated squeegee may be used. Application using a syringe may be employed.

(3) Step of Evaporating Second Solvent, Step of Reducing Members to be Bonded, and Step of Melting Solder A step of evaporating the second solvent, a step of reducing the members to be bonded, and a step of melting the solder are described in more detail using a soldering apparatus 1 shown in FIG. 3.

As soldering targets with the solder paste S applied, a substrate W and an electronic component P are used. As the reducing gas, a formic acid gas is used.

It should be noted that although the method for producing a soldered product as a third embodiment of the present invention is described together with the operation of the soldering apparatus 1 shown in FIG. 3 in the following description, the production method may be implemented by another apparatus.

Referring first to FIG. 3, the soldering apparatus 1 is described. FIG. 3 is a general configuration diagram of the soldering apparatus 1. The soldering apparatus 1 comprises: a treatment part 10 having a chamber 11 defining a treatment space 11s that is a space in which the members to be bonded are soldered to each other; a formic acid supply part 20 as a reducing gas supply part that supplies a formic acid gas F as a reducing gas to the chamber 11; a catalyst unit 33 as a reducing gas treatment part that reduces the concentration of the formic acid gas F in the soldering apparatus 1 before it is discharged; a controller 50 for controlling the operation of the soldering apparatus 1; and a housing 100 for housing the treatment part 10, the formic acid supply part 20, the catalyst unit 33, and the controller 50.

The soldering apparatus 1 is an apparatus for bonding the substrate W and the electronic component P with the solder paste S. The substrate W and the electronic component P both have a metal portion on a surface thereof, and are bonded so that the metal portions can be electrically conductive with each other via the solder. The substrate W and the electronic component P are transported into the chamber 11 with the solder paste S interposed therebetween, and the solder is melted in the chamber 11 to bond them. In the following, the substrate W, the solder paste S and the electronic component P stacked on top of each other with the solder still unmelted are referred to as "to-be-bonded members B," and the product obtained by bonding the substrate W and the electronic component P with molten solder, that is, resulting bonded product, is referred to as "soldered product C."

The chamber 11 is configured to make the treatment space 11s airtight by closing a carry-in/out port 11a with a shutter 11d. The material and shape of the chamber 11 are selected so that it can endure even when the pressure in the treatment space 11s is reduced to approximately 10 Pa (absolute pressure).

In the chamber 11, a carrier plate 12 on which the to-be-bonded members B are placed, and a heater 13 for heating the carrier plate 12 are provided.

The heater 13 is configured to be able to heat the carrier plate 12 to a bonding temperature that is higher than the melting temperature of the solder.

The formic acid supply part 20 directs the formic acid gas F into the chamber 11. While the formic acid gas F is used as the reducing gas in this description, any gas that can reduce metal oxides formed on the surfaces to be bonded of the substrate W and the electronic component P, such as carboxylic acid gases other than the formic acid gas F, organic acid gases other than carboxylic acid gases, gases of organic compounds other than organic acids, and other reductive gases other than organic compounds, may be used. Examples of other reductive gases include a hydrogen gas. In this description, the formic acid gas F is used as the reducing gas from the viewpoint of lowering the reduction temperature to below the melting temperature of the solder and the viewpoint of availability.

The catalyst unit 33 is a device that reduces the concentration of formic acid in an exhaust gas E discharged from the soldering apparatus 1 to such a level that the environment is not affected. The term "gas G" is a collective term for the gases discharged from the chamber 11.

A vacuum pump 31 is installed as a pressure reduction pump that discharges the gas G in the chamber 11 so that the pressure in the chamber 11 can be reduced to approximately 10 Pa (absolute pressure).

The controller 50 is configured to be able to open and close the shutter 11d. The controller 50 is also configured to be able to heat the carrier plate 12 by switching between on and off of the heater 13 and varying the output of the heater 13. The controller 50 is also configured to be able to supply the formic acid gas F toward the chamber 11. The controller 50 is also configured to be able to control the start and stop of the vacuum pump 31. In the controller 50, a sequence of operation of the soldering apparatus 1 (described later) is stored.

Figure 4:
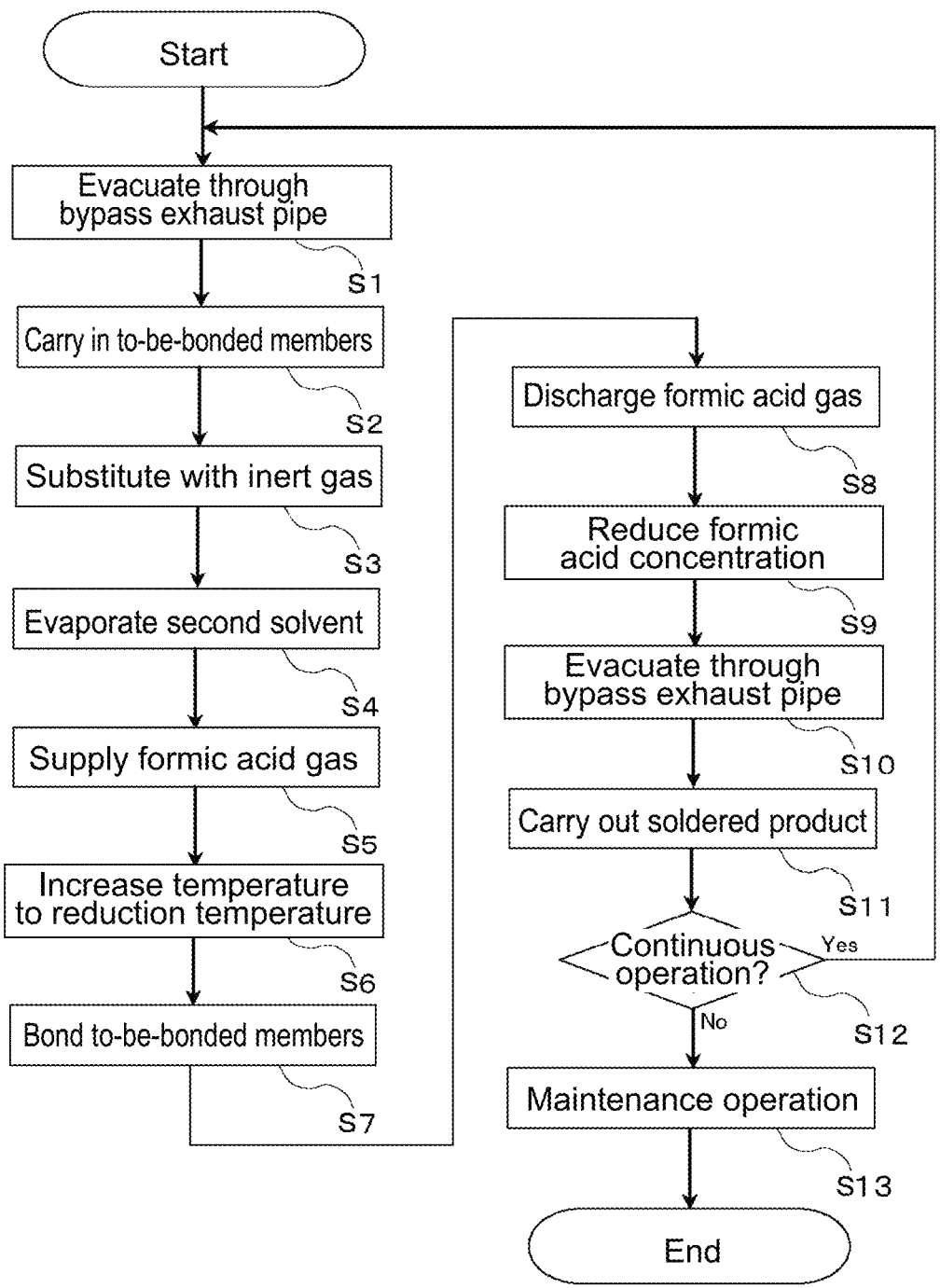
FIG. 4 shows a flowchart of an example solder bonding procedure using the soldering apparatus 1.

Referring continuously to FIG. 4, a method for producing a soldered product C according to an embodiment of the present invention is described. FIG. 4 is a flowchart showing a solder bonding procedure for the soldered product C. In the following description, when mention is made of the configuration of the soldering apparatus 1, reference is made to FIG. 3 as appropriate.

When a button (not shown) for opening the shutter 11d is pressed in order to carry the to-be-bonded members B into the soldering apparatus 1, the controller 50 activates the vacuum pump 31 to start discharge of the gas G in the chamber 11 (S1) before opening the shutter 11d. Then, the controller 50 moves the carrier plate 12 until most part of the carrier plate 12 is outside the chamber 11. By discharging the gas G in the chamber 11 from the chamber 11 before the shutter 11d is opened, the gas G in the chamber 11 can be prevented from flowing out of the soldering apparatus 1 through the carry-in/out port 11a when the shutter 11d is opened. After the shutter 11d is opened and most part of the carrier plate 12 is moved out of the chamber 11, the to-be-bonded members B are placed on the carrier plate 12. Then, as the carrier plate 12 is moved into the chamber 11, the to-be-bonded members B are carried into the chamber 11 (S2).

After the to-be-bonded members B are carried into the chamber 11, the controller 50 closes the shutter 11d to make the chamber 11 airtight. Then, in order to remove the atmosphere that has entered the chamber 11 while the shutter 11d was open and create an inert gas atmosphere, the controller 50 discharges the gas G in the chamber 11 and then introduces an inert gas N. By repeating this procedure, the oxygen concentration in the chamber 11 is reduced (S3). The oxygen concentration is preferably 5 ppm or lower. The inert gas N is a nitrogen gas, for example.

Next, the controller 50 turns on the heater 13 to increase the temperature of the carrier plate 12 or, more specifically, the temperature of the to-be-bonded members B to a temperature at which the second solvent included in the solder paste S vaporizes (evaporates) (S4). As the temperature increases, mainly the second solvent evaporates and is removed from the solder paste S. In this embodiment, the pressure inside the chamber 11 may be reduced to a vacuum (reduced pressure) in order to accelerate the evaporation of the second solvent. As described above, the second solvent may be evaporated to form gaps between solder powder particles by heating in an atmosphere free of the formic acid gas F before the formic acid gas F is supplied.

While description is made of a case where the vaporization temperature is lower than the reduction temperature in this embodiment, the vaporization temperature may be equal to the following reduction temperature. When the vaporization temperature is equal to the reduction temperature, evaporation of a portion of the second solvent and reduction of the to-be-bonded members B occur simultaneously. In other words, there is a case where the step (S4) and steps (S5) and (S6) as subsequent steps occur concurrently.

After the second solvent evaporates to form gaps between solder powder particles, the controller 50 supplies the formic acid gas F from the formic acid supply part 20 into the chamber 11 (S5) and keeps the heater 13 on to increase the temperature of the carrier plate 12 or, more specifically, the temperature of the to-be-bonded members B, to the reduction temperature (S6). The reduction temperature is the temperature at which the oxides on the to-be-bonded members B are reduced by formic acid. Here, in this embodiment, because the reduction temperature is lower than the melting temperatures of the solder powder included in the solder paste S, the solder powder does not melt. Thus, the formic acid gas readily penetrates into the formed gaps and the oxide films can be favorably removed before the to-be-bonded members B are soldered to each other. When the formic acid gas F is supplied after a vacuum is created inside the chamber 11, the formic acid gas F readily penetrates into the gaps between the solder powder particles. The step of supplying the formic acid gas F into the chamber 11 (S5) and the step of increasing the temperature of the to-be-bonded members B to the reduction temperature (S6) correspond to the reduction steps. The formic acid gas F may be supplied after the completion of temperature rise to the reduction temperature.

After the reduction steps (S5, S6), the output of the heater 13 is increased, with the atmosphere of the formic acid gas F in the chamber 11 maintained to increase the temperature of the carrier plate 12 or, more specifically, the temperature of the to-be-bonded members B, to the bonding temperature in order to melt the solder powder and solder-bond the to-be-bonded members B (S7). The bonding temperature is any temperature higher than the melting temperature of the solder powder included in the solder paste S, and is 30 to 50° C. higher than the melting temperature in this embodiment. It should be noted that when the first solvent remains, the first solvent evaporates during the reduction step (S5, S6) and the bonding step (S7), and the fatty acid amide evaporates and disappears together with the evaporation of the first solvent.

After the solder in the to-be-bonded members B is melted, the controller 50 turns off the heater 13. By starting cooling in this way, the temperature of the to-be-bonded members B decreases, and the solder solidifies when the temperature falls below its melting point. As a result, the soldered product C is obtained. At this time, the carrier plate 12 may be forcibly cooled to accelerate solidification of the solder. Then, the vacuum pump 31 is activated and a main exhaust valve 41v is opened to discharge the formic acid gas F from the chamber 11 (S8), and the inert gas N is introduced to return the pressure in the chamber 11 to normal pressure. The formic acid gas F discharged from the chamber 11 flows into the catalyst unit 33. The formic acid gas F is subjected to decomposition of the formic acid in the catalyst unit 33, and discharged from the soldering apparatus 1 as the exhaust gas E with a formic acid concentration reduced to a predetermined level or lower (S9). When the production of the soldered product C is completed, the controller 50 discharges the gas G in the chamber 11 through a bypass exhaust pipe 42 (S10), and opens the shutter 11d. As a result, the soldered product C can be taken out of the chamber 11 (S11).

When the soldered product C is carried out of the chamber 11, the controller 50 determines whether continuous operation is performed (S12). When continuous operation is performed, the procedure returns to the step of discharging the gas G in the chamber 11 (S1). When continuous operation is not performed, maintenance operation is performed (S13).

While the to-be-bonded members B are heated in an atmosphere of the formic acid gas F to melt the solder powder in the solder paste S in the above description, the to-be-bonded members B may be heated in a vacuum (for example, about 100 Pa (absolute pressure)) to melt the solder powder. When the to-be-bonded members B are heated in a vacuum, the treatment and discharge steps (S8, S9) are carried out right after the reduction steps (S5, S6). When the chamber 11 includes almost no formic acid gas F when the shutter 11d is opened to take the soldered product C out of the chamber 11 (S11), the shutter 11d may be opened without creating a negative pressure in the chamber 11 (without activating the vacuum pump 31). Because the solder paste used in the present invention causes an absence of flux residue, solder scattering (or flux scattering) can be reduced even when the to-be-bonded members B are bonded in a vacuum.

Figure 5:
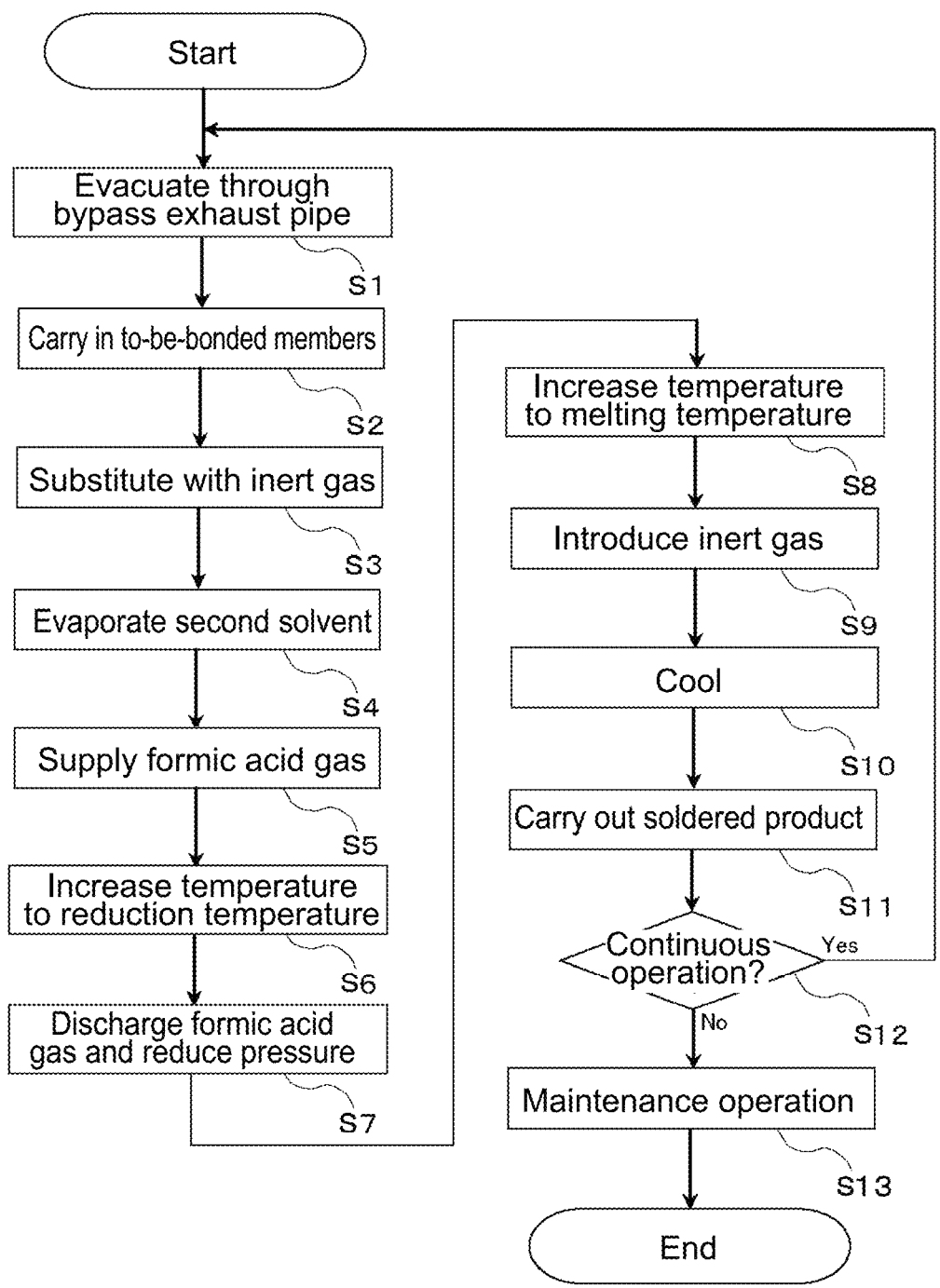
FIG. 5 shows a flowchart of another example solder bonding procedure using the soldering apparatus 1.

Referring to FIG. 5, a method for producing a soldered product C according to another embodiment of the present invention is described, as an example in which the to-be-bonded members B are bonded in a vacuum. FIG. 5 is a flowchart illustrating a solder bonding procedure for a soldered product C. In the following description, when mention is made of the configuration of the soldering apparatus 1, reference is made to FIG. 3 as appropriate.

Steps (S1) to (S6) are the same as those in the production method shown in FIG. 4.

After the completion of step (S6), the controller 50 activates the vacuum pump 31 and opens the main exhaust valve 41v to discharge the formic acid gas F from the chamber 11 and reduce the pressure in the chamber 11 (S7). With the reduced pressure (vacuum) in the chamber 11 maintained, the output of the heater 13 is increased to increase the temperature of the carrier plate 12 or, more specifically, the temperature of the to-be-bonded members B to the bonding temperature (S8) to melt the solder and solder-bond the to-be-bonded members B to each other. After the to-be-bonded members B are solder-bonded to each other, the controller 50 introduces an inert gas N to rupture the vacuum inside the chamber 11 (S9). The controller 50 turns off the heater 13 and starts cooling (S10). Then, the temperature of the to-be-bonded members B decreases and the solder solidifies when the temperature falls below its melting point. As a result, the soldered product C is obtained. When the production of the soldered product C is completed, the controller 50 discharges the gas G in the chamber 11 via the bypass exhaust pipe 42 and opens the shutter 11d. As a result, the soldered product C can be taken out of the chamber 11 (S11).

Steps (S12) to (S13) are the same as those in the production method shown in FIG. 4.

When the inert gas N is introduced after the solder is melted as described above, cavities (or voids) can be compressed and squashed. When the solder is solidified after the cavities are squashed, the decrease of fatigue life caused by voids in the solder can be further reduced.

As described above, according to the soldering apparatus 1, because the devices necessary for solder bonding in a vacuum such as the treatment part 10, the formic acid supply part 20, the catalyst unit 33 and the controller 50 are housed in the housing 100, solder bonding using the formic acid gas F can be accomplished appropriately and completely within the soldering apparatus 1. In addition, according to the method for producing a soldered product C according to this embodiment, appropriate vacuum soldering can be carried out using the solder paste S and the formic acid gas F.

While description is made using the substrate W and the electronic component P together with the solder paste S as to-be-bonded members in the above description, the to-be-bonded members may be members other than the substrate W and the electronic component P as long as they have a metal portion suitable for solder bonding on their surfaces.

The method for producing a soldered product in the present application may further comprise a coating step of coating the soldering targets that have undergone solder bonding. Because the solder bonding according to the present invention generates almost no residue, no problem arises about the adhesion with a coating agent. Thus, the solder-bonded parts are appropriately protected when coated in the coating step.

The method for producing a soldered product in this application can be also used in a method for producing a BGA (Ball Grid Array) package. In other words, after the flux in this application is applied (printed) on a BGA package substrate as a temporal fixative and solder balls with a particle size of about 100 to 350 μm are placed on the flux, the method for producing a soldered product in this application may be used to achieve bonding of the solder balls (formation of bumps).

The method for producing a soldered product in this application can be also use for mounting of a BGA package. In other words, after the solder paste in this application is applied (printed) on a printed circuit board as a temporal fixative and solder bumps of a BGA package are placed on the solder paste, the method for producing a soldered product in this application may be used to achieve bonding of the solder bumps.

As described above, the present invention allows the use of a flux and a solder paste with a simpler composition and makes it possible to achieve reduction of oxidized metals and improvement of reducibility as well as improvement of meltability, which are conventionally achieved by the use of a reducing agent and an activator, with introduction of a reducing gas and vacuum on the apparatus side. In addition, its composition causes an absence of flux residue in the solder-bonded part and enables a solder-bonded part with a low void content to be achieved. It should be noted that while the present invention has been described in connection with soldering, the present invention is not limited to "soldering" but is also useful in "brazing."

EXAMPLE

Next, examples in the present invention are described together with comparative examples. It should be noted that the present invention is not construed as being limited by the following examples.

Materials

Solder Powder

Solder powder (A): Sn—3Ag—0.5Cu (abbreviation SAC305), melting point about 220° C., average particle size 40 gμm, particles of 38 μm or smaller 15%
Solder powder (B): Sn—3Ag—0.5Cu (abbreviation SAC305), melting point about 220° C., average particle size 33 μm, particles of 38 μm or smaller 80%
Solder powder (C): Sn—3Ag—0.5Cu (abbreviation SAC305), melting point about 220° C., average particle size 30 μm, particles of 38 μm or smaller 90%, particles of 20 μm or smaller 5%
Solder powder (D): Sn—3Ag—0.5Cu (abbreviation SAC305), melting point about 220° C., average particle size 19 μm, particles of 25 μm or smaller 90%, particles of 10 μm or smaller 5%

Amide

Fatty acid amide (A): Stearic acid amide (manufactured by Kao Corporation)
Fatty acid amide (B): Lauric acid amide (manufactured by Nippon Kasei Chemical Co., Ltd.)
Polyamide: Light Amide WH-255 (manufactured by Kyoeisha Chemical Co., Ltd.)

Solvent

First solvent (A): Trimethylol propane (manufactured by Mitsubishi Gas Chemical Company, Inc.)
First solvent (B): Isooctadecanol (manufactured by Nissan Chemical Industries, Ltd.)
First solvent (C): 1-Hexadecanol (manufactured by Tokyo Chemical Industry Co., Ltd.)
First solvent (D): 2,4-Dimethyl-1,5-pentanediol (manufactured by Tokyo Chemical Industry Co., Ltd.)
Second solvent (A): 2,2-Dimethyl-1,3-hexanediol (manufactured by KH NeoChem Co., Ltd.)
Second solvent (B): 2-Methyl-1,3-hexanediol (manufactured by Tokyo Chemical Industry Co., Ltd.)
Second solvent (C): 3-Methyl-1,5-pentanediol (manufactured by Tokyo Chemical Industry Co., Ltd.)
Second solvent (D): 3-Methyl-1,3-butanediol (manufactured by Tokyo Chemical Industry Co., Ltd.)

Preparation of Solder Pastes 1

Example 1

A flux was prepared by mixing 6% by mass of the fatty acid amide (A), 6% by mass of the fatty acid amide (B), 2% by mass of the first solvent (A) and 86% by mass of the second solvent (A).
A solder paste was prepared by mixing and stirring 8.5% by mass of the prepared flux and 91.5% by mass of a solder alloy powder (A) (Sn:Ag:Cu=96.5:3.0:0.5 (% by mass)).

Example 2

A flux was prepared by mixing 6% by mass of the fatty acid amide (A), 6% by mass of the fatty acid amide (B), 4% by mass of the first solvent (A) and 84% by mass of the second solvent (A).
A solder paste was prepared by mixing and stirring 8.5% by mass of the prepared flux and 91.5% by mass of the solder alloy powder (A) (Sn:Ag:Cu=96.5:3.0:0.5 (% by mass)).

Example 3

A flux was prepared by mixing 6% by mass of the fatty acid amide (A), 6% by mass of the fatty acid amide (B), 4% by mass of the first solvent (B), 84% by mass of the second solvent (A).

A solder paste was prepared by mixing and stirring 8.5% by mass of the prepared flux and 91.5% by mass of the solder alloy powder (A) (Sn:Ag:Cu=96.5:3.0:0.5 (% by mass)).

Example 4

A flux was prepared by mixing 6% by mass of the fatty acid amide (A), 6% by mass of the fatty acid amide (B), 12% by mass of the first solvent (B) and 76% by mass of the second solvent (A).

A solder paste was prepared by mixing and stirring 8.5% by mass of the prepared flux and 91.5% by mass of the solder alloy powder (A) (Sn:Ag:Cu=96.5:3.0:0.5 (% by mass)).

Example 5

A flux was prepared by mixing 3% by mass of the fatty acid amide (A), 3% by mass of the fatty acid amide (B), 12% by mass of the first solvent (B) and 82% by mass of the second solvent (A).

A solder paste was prepared by mixing and stirring 8.5% by mass of the prepared flux and 91.5% by mass of the solder alloy powder (A) (Sn:Ag:Cu=96.5:3.0:0.5 (% by mass)).

Example 6

A flux was prepared by mixing 12% by mass of the fatty acid amide (A), 12% by mass of the fatty acid amide (B), 6% by mass of the first solvent (B) and 70% by mass of the second solvent (A).

A solder paste was prepared by mixing and stirring 8.5% by mass of the prepared flux and 91.5% by mass of a lead-free solder alloy powder (A) (Sn:Ag:Cu=96.5:3.0:0.5 (% by mass)).

Example 7

A flux was prepared by mixing 6% by mass of the fatty acid amide (A), 6% by mass of the fatty acid amide (B), 4% by mass of the first solvent (C) and 84% by mass of the second solvent (A).

A solder paste was prepared by mixing and stirring 8.5% by mass of the prepared flux and 91.5% by mass of the lead-free solder alloy powder (A) (Sn:Ag:Cu=96.5:3.0:0.5 (% by mass)).

Example 8

A flux was prepared by mixing 6% by mass of the fatty acid amide (A), 6% by mass of the fatty acid amide (B), 4% by mass of the first solvent (D) and 84% by mass of the second solvent (A).

A solder paste was prepared by mixing and stirring 8.5% by mass of the prepared flux and 91.5% by mass of the lead-free solder alloy powder (A) (Sn:Ag:Cu=96.5:3.0:0.5 (% by mass)).

Comparative Example 1

A flux was prepared by mixing 6% by mass of the fatty acid amide (A), 6% by mass of the fatty acid amide (B) and 88% by mass of the second solvent (A).

A solder paste was prepared by mixing and stirring 8.5% by mass of the prepared flux and 91.5% by mass of the solder alloy powder (A) (Sn:Ag:Cu=96.5:3.0:0.5 (% by mass)).

Comparative Example 2

A flux was prepared by mixing 6% by mass of the fatty acid amide (A), 6% by mass of the fatty acid amide (B), 21% by mass of the first solvent (B) and 67% by mass of the second solvent (A).

A solder paste was prepared by mixing and stirring 8.5% by mass of the prepared flux and 91.5% by mass of the solder alloy powder (A) (Sn:Ag:Cu=96.5:3.0:0.5 (% by mass)).

Comparative Example 3

A flux was prepared by mixing 6% by mass of the fatty acid amide (A), 6% by mass of the fatty acid amide (B), 21% by mass of the first solvent (A) and 67% by mass of the second solvent (A).

A solder paste was prepared by mixing and stirring 8.5% by mass of the prepared flux and 91.5% by mass of the solder alloy powder (A) (Sn:Ag:Cu=96.5:3.0:0.5 (% by mass)).

Comparative Example 4

A flux was prepared by mixing 5% by mass of the polyamide and 95% by mass of the second solvent (A).

A solder paste was prepared by mixing and stirring 8.5% by mass of the prepared flux and 91.5% by mass of a lead-free solder alloy powder (B) (Sn:Ag:Cu=96.5:3.0:0.5 (% by mass)).

Preparation of Test Pieces 1

Nickel-plated copper substrates (70×70 mm, thickness 1 mm) were prepared as test pieces, and the solder pastes of Examples and Comparative Examples were applied to a thickness (metal mask thickness) of 600 μm in a 40×35 mm sized region on a surface of each substrate. A nickel-plated copper substrate (40×35 mm, thickness 1 mm) was mounted on the applied solder paste.

Reflow Conditions 1

Figure 6:
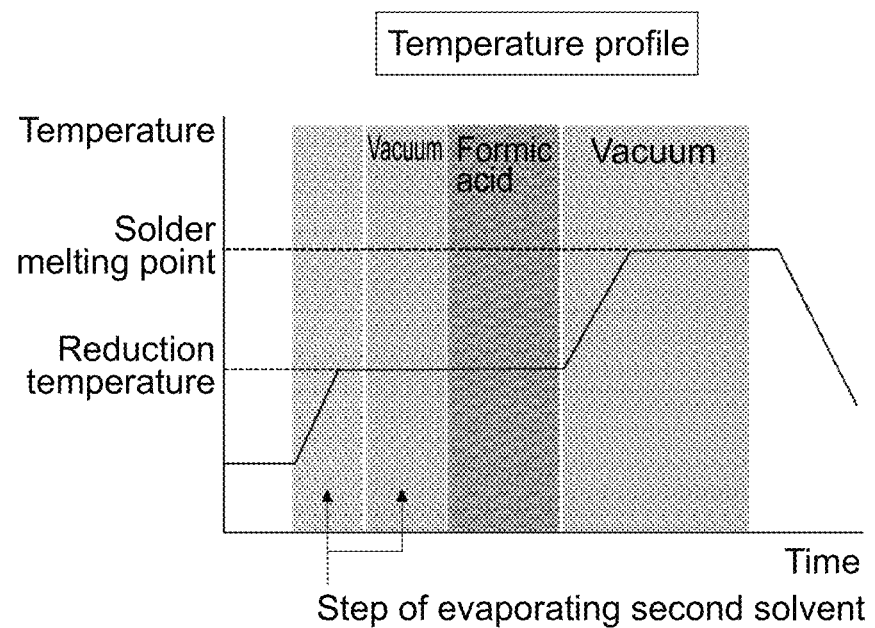
FIG. 6 shows a graph of an example temperature profile during reflow.

The reflow conditions are as shown in the "Temperature profile" in FIG. 6.
  Preliminary heating 1 (second solvent evaporation step): Nitrogen atmosphere (atmospheric pressure) 200° C. or lower
  Preliminary heating 2 (second solvent evaporation step): Vacuum atmosphere (200 Pa or lower), 200° C., 120 seconds
  Preliminary heating 3 (reduction step): Formic acid+ nitrogen atmosphere (atmospheric pressure, formic acid concentration 3% Vol), 200° C., 240 seconds
  Main heating (solder melting step): Vacuum atmosphere (200 Pa), peak temperature 260° C., 220° C. or higher, heating time 90 seconds Void Determination 1

After the substrate with the solder paste printed thereon was heated under the reflow conditions, the presence or absence of voids was checked. The checking method is as follows: the soldered portion of each substrate was observed with an X-ray transmission device (Cheetah Evo manufactured by Yxlon International), and the substrates with a void content of less than 5% were determined as OK and substrates with a void content of 5% or higher were determined as NG.

Residue Amount Determination 1

The flux residue after heating under the reflow conditions was determined as NG when flux residue could be clearly recognized by visual inspection over 3 mm or more from edges of the solder-bonded part or at locations away from the solder-bonded part, or when flux residue could be detected by an IR method (infrared spectroscopy, FT-IR Frontier, Spotlight400 manufactured by PerkinElmer Co., Ltd.). The flux residue was determined as OK when flux residue could not be visually recognized or could be recognized only slightly within 3 mm from the edges of the solder-bonded part and could not be detected by an IR method.

TABLE 1

| | | Flux composition (% by mass) | | | | | | | |
|---|---|---|---|---|---|---|---|---|---|
| | Vaporization temperature | Example 1 | Example 2 | Example 3 | Example 4 | Example 5 | Example 6 | Example 7 | Example 8 |
| First solvent (A) | 235° C. | 2 | 4 | 0 | 0 | 0 | 0 | 0 | 0 |
| First solvent (B) | 225° C. | 0 | 0 | 4 | 12 | 12 | 6 | 0 | 0 |
| First solvent (C) | 230° C. | 0 | 0 | 0 | 0 | 0 | 0 | 4 | 0 |
| First solvent (D) | 195° C. | 0 | 0 | 0 | 0 | 0 | 0 | 0 | 4 |
| Fatty acid amide (A) | 305° C. | 6 | 6 | 6 | 6 | 3 | 12 | 6 | 6 |
| Fatty acid amide (B) | 255° C. | 6 | 6 | 6 | 6 | 3 | 12 | 6 | 6 |
| Second solvent (A) | 177° C. | 86 | 84 | 84 | 76 | 82 | 70 | 84 | 84 |

The vaporization temperature is a temperature at which the mass measured by thermogravimetry at a nitrogen flow rate of 0.2 to 0.3 L per minute and a temperature increase rate of 10° C. per minute becomes zero.

TABLE 2

| | | Flux composition (% by mass) | | | |
|---|---|---|---|---|---|
| | Vaporization temperature | Comparative Example 1 | Comparative Example 2 | Comparative Example 3 | Comparative Example 4 |
| First solvent (A) | 235° C. | 0 | 0 | 21 | 0 |
| First solvent (B) | 225° C. | 0 | 21 | 0 | 0 |
| Fatty acid amide (A) | 305° C. | 6 | 6 | 6 | 0 |
| Fatty acid amide (B) | 255° C. | 6 | 6 | 6 | 0 |
| Polyamide | 320° C. or higher | 0 | 0 | 0 | 5 |
| Second solvent (A) | 177° C. | 88 | 67 | 67 | 95 |

TABLE 3

Solder paste characteristics

| | Example 1 | Example 2 | Example 3 | Example 4 | Example 5 | Example 6 | Example 7 | Example 8 |
|---|---|---|---|---|---|---|---|---|
| Flux | 8.5 | 8.5 | 8.5 | 8.5 | 8.5 | 8.5 | 8.5 | 8.5 |
| Solder powder (parts by mass) | 91.5 | 91.5 | 91.5 | 91.5 | 91.5 | 91.5 | 91.5 | 91.5 |
| Solder powder type | SAC 305 | SAC 305 | SAC 305 | SAC 305 | SAC 305 | SAC 305 | SAC 305 | SAC 305 |
| Solder powder particles of 38 μm or smaller | Solder powder (A) 15% | Solder powder (A) 15% | Solder powder (A) 15% | Solder powder (A) 15% | Solder powder (A) 15% | Solder powder (A) 15% | Solder powder (A) 15% | Solder powder (A) 15% |
| Voids | OK | OK | OK | OK | OK | OK | OK | OK |
| Residues | OK | OK | OK | OK | OK | OK | OK | OK |

TABLE 4

Solder paste characteristics

| | Comparative Example 1 | Comparative Example 2 | Comparative Example 3 | Comparative Example 4 |
|---|---|---|---|---|
| Flux | 8.5 | 8.5 | 8.5 | 8.5 |
| Solder powder (parts by mass) | 91.5 | 91.5 | 91.5 | 91.5 |
| Solder powder type | SAC305 | SAC305 | SAC305 | SAC305 |
| Solder powder particles of 38 μm or smaller | Solder powder (A) 15% | Solder powder (A) 15% | Solder powder (A) 15% | Solder powder (B) 80% |
| Voids | NG | OK | OK | NG |
| Residues | OK | NG | NG | NG |

In Examples 1 to 8, it was possible to reduce voids and reduce residues (allow no residue to remain). It is particularly useful in the production of a power device in which a large area of solder bonding is performed (solder bonding for a heat sink or the like) when voids can be reduced to less than 5%. It should be noted that the fatty acid amide preferably has a vaporization temperature of 350° C. or lower as described above. In Comparative Example 1, because no first solvent was included, the fatty acid amide could not be evaporated and voids were produced. In Comparative Examples 2 to 3, because the amount of the first solvent was too large, the first solvent remained as residues. In Comparative Example 4, because a polyamide was used instead of a fatty acid amide, flux residue remained, and many voids were produced due to continuous release of gas during vaporization.

Preparation of Solder Paste 2

Example 9

A flux was prepared by mixing 6% by mass of the fatty acid amide (A), 6% by mass of the fatty acid amide (B), 8% by mass of the first solvent (A) and 80% by mass of the second solvent (B).

A solder paste was prepared by mixing and stirring 8.5% by mass of the prepared flux and 91.5% by mass of a solder alloy powder (C) (Sn:Ag:Cu=96.5:3.0:0.5 (% by mass)).

Example 10

A flux was prepared by mixing 6% by mass of the fatty acid amide (A), 6% by mass of the fatty acid amide (B), 8% by mass of the first solvent (A) and 80% by mass of the second solvent (C).

A solder paste was prepared by mixing and stirring 8.5% by mass of the prepared flux and 91.5% by mass of the solder alloy powder (C) (Sn:Ag:Cu=96.5:3.0:0.5 (% by mass)).

Example 11

A flux was prepared by mixing 6% by mass of the fatty acid amide (A), 6% by mass of the fatty acid amide (B), 8% by mass of the first solvent (B) and 80% by mass of the second solvent (D).

A solder paste was prepared by mixing and stirring 8.5% by mass of the prepared flux and 91.5% by mass of the solder alloy powder (C) (Sn:Ag:Cu=96.5:3.0:0.5 (% by mass)).

Example 12

A flux was prepared by mixing 6% by mass of the fatty acid amide (A), 6% by mass of the fatty acid amide (B), 8% by mass of the first solvent (B) and 80% by mass of the second solvent (D).

A solder paste was prepared by mixing and stirring 8.5% by mass of the prepared flux and 91.5% by mass of a solder alloy powder (D) (Sn:Ag:Cu=96.5:3.0:0.5 (% by mass)).

Comparative Example 5

A flux was prepared by mixing 6% by mass of the fatty acid amide (A), 6% by mass of the fatty acid amide (B) and 88% by mass of the second solvent (D).
A solder paste was prepared by mixing and stirring 8.5% by mass of the prepared flux and 91.5% by mass of the solder alloy powder (C) (Sn:Ag:Cu=96.5:3.0:0.5 (% by mass)).

Comparative Example 6

A flux was prepared by mixing 6% by mass of the fatty acid amide (A), 6% by mass of the fatty acid amide (B) and 88% by mass of the second solvent (B).
A solder paste was prepared by mixing and stirring 8.5% by mass of the prepared flux and 91.5% by mass of the solder alloy powder (C) (Sn:Ag:Cu=96.5:3.0:0.5 (% by mass)).

Preparation of Test Pieces 2

As test pieces, oxygen-free copper substrates (44×35 mm, thickness 1 mm) were prepared, and the solder pastes of Examples and Comparative Examples were applied to a thickness (metal mask thickness) of 200 μm in a 12.8×9.8 mm sized region on a surface of each substrate. A nickel-plated copper substrate (12.8×9.8 mm, thickness 1 mm) was mounted on the applied solder paste.

Reflow Conditions 2

The reflow conditions are as shown in the "Temperature profile" in FIG. 6.

Preliminary heating 1 (second solvent evaporation step): Nitrogen atmosphere (atmospheric pressure) 200° C. or lower, 60 seconds
Preliminary heating 2 (second solvent evaporation step): Vacuum atmosphere (200 Pa or lower), 200° C., 60 seconds
Preliminary heating 3 (reduction step): Formic acid+ nitrogen atmosphere (atmospheric pressure, formic acid concentration 3% Vol), 200° C., 120 seconds
Main heating (solder melting step): Vacuum atmosphere (200 Pa), peak temperature 250° C., 220° C. or higher, heating time 40 seconds Void Determination 2

After the substrate with the solder paste printed thereon was heated under the reflow conditions, the presence or absence of voids was checked. The checking method is as follows: the soldered portion of each substrate was observed with an X-ray transmission device (Cheetah Evo manufactured by Yxlon International), and the substrates with a void content of less than 3% were determined as OK and substrates with a void content of 3% or higher were determined as NG.

Residue Amount Determination 2

The flux residue after heating under the reflow conditions was determined as NG when flux residue could be clearly recognized by visual inspection over 3 mm or more from edges of the solder-bonded part or at locations away from the solder-bonded part, or when flux residue could be detected by an IR method (infrared spectroscopy, FT-IR Frontier, Spotlight400 manufactured by PerkinElmer Co., Ltd.). The flux residue was determined as OK when flux residue could not be visually recognized or could be recognized only slightly within 3 mm from the edges of the solder-bonded part and could not be detected by an IR method.

TABLE 5

| | Flux composition (% by mass) | | | | | | |
|---|---|---|---|---|---|---|---|
| | Vaporization temperature | Example 9 | Example 10 | Example 11 | Example 12 | Comparative Example 5 | Comparative Example 6 |
| First solvent (A) | 235° C. | 8 | 8 | 8 | 8 | 0 | 0 |
| Fatty acid amide (A) | 305° C. | 6 | 6 | 6 | 6 | 6 | 6 |
| Fatty acid amide (B) | 255° C. | 6 | 6 | 6 | 6 | 6 | 6 |
| Second solvent (B) | 180° C. | 80 | 0 | 0 | 0 | 0 | 88 |
| Second solvent (C) | 188° C. | 0 | 80 | 0 | 0 | 0 | 0 |
| Second solvent (D) | 153° C. | 0 | 0 | 80 | 80 | 88 | 0 |

The vaporization temperature is a temperature at which the mass measured by thermogravimetry at a nitrogen flow rate of 0.2 to 0.3 L per minute and a temperature increase rate of 10° C. per minute becomes zero.

TABLE 6

Solder paste characteristics

| | Example 9 | Example 10 | Example 11 | Example 12 | Comparative Example 5 | Comparative Example 6 |
|---|---|---|---|---|---|---|
| Flux | 8.5 | 8.5 | 8.5 | 8.5 | 8.5 | 8.5 |
| Solder powder (parts by mass) | 91.5 | 91.5 | 91.5 | 91.5 | 91.5 | 91.5 |
| Solder powder type | SAC305 | SAC305 | SAC305 | SAC305 | SAC305 | SAC305 |
| Solder powder particles of 38 μm or smaller | Solder powder (C) 90% | Solder powder (C) 90% | Solder powder (C) 90% | — | Solder powder (C) 90% | Solder powder (C) 90% |
| Solder powder particles of 20 μm or smaller | 5% | 5% | 5% | — | 5% | 5% |
| Solder powder particles of 25 μm or smaller | — | — | — | Solder powder (D) 90% | — | — |
| Solder powder particles of 10 μm or smaller | — | — | — | 5% | — | — |
| Voids | OK | OK | OK | OK | NG | NG |
| Residues | OK | OK | OK | OK | OK | OK |

In Examples 9 to 12, it was possible to reduce voids and reduce residues (allow no residue to remain). It is particularly useful in solder bonding of semiconductor chips that demands stricter standards when voids can be reduced to less than 3%. In Comparative Example 5 and Comparative Example 6, because no first solvent was included, the fatty acid amide could not be evaporated and voids were produced.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "including" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

DESCRIPTION OF REFERENCE NUMERALS AND SYMBOLS

1 soldering apparatus
11 chamber
11s treatment space
20 formic acid supply part
31 vacuum pump
33 catalyst unit
41v main exhaust valve
42 bypass exhaust pipe 50 controller
100 housing
C soldered product
B to-be-bonded members
F reducing gas, formic acid gas
G gas
M pattern, metal mask
N inert gas
P electronic component
Q squeegee
S', S solder paste
T soldering target
W substrate

The invention claimed is:

1. A flux, comprising:
a fatty acid amide;
a first solvent having a temperature, at which a mass of the first solvent measured by thermogravimetry at a nitrogen flow rate of 0.2 to 0.3 L per minute and a temperature increase rate of 10° C. per minute becomes zero, of from 180° C. to lower than 260° C.;
a second solvent having a temperature, at which a mass of the second solvent measured by thermogravimetry at a nitrogen flow rate of 0.2 to 0.3 L per minute and a temperature increase rate of 10° C. per minute becomes zero, of from 100° C. to lower than 220° C., and
a third solvent being 3-methyl-1,5-pentanediol, wherein:
the first solvent is at least one selected from the group consisting of 1-hexadecanol, isooctadecanol, trimethylol propane, 2,4-diethyl-1,5-pentanediol, and 2,4-dimethyl-1,5-pentanediol,
the second solvent is at least one selected from the group consisting of 2,5-dimethyl-2,5-hexanediol, 2,2-dimethyl-1,3-propanediol, oleyl alcohol, and 3-methyl-1,3-butanediol,
the flux includes 6 to 24% by mass of the fatty acid amide, 2 to 15% by mass of the first solvent, and 70 to 86% by mass of a total of the second and third solvents, and
the flux includes no reducing agents for reduction removal of surface oxide films of solder, and includes no activators for improving reducibility,
whereby a mixture of the flux and a solder powder is obtainable as a solder paste and an absence of flux residue is achievable.

2. The flux according to claim 1, wherein:
the temperature of the first solvent is higher than the temperature of the second solvent, and
the temperature of the first solvent and the temperature of the second solvent differ by 15° C. or more.

3. The flux according to claim 1, including 6 to 24% by mass of the fatty acid amide, 2 to 15% by mass of the first solvent, and 76 to 86% by mass of the second and third solvents.

4. The flux according to claim 1, consisting essentially of:
the fatty acid amide;
the first solvent;
the second solvent; and
the third solvent.

5. A solder paste, comprising:
a solder powder; and
the flux according to claim 1.

6. A solder paste, consisting essentially of:
a solder powder; and
the flux according to claim 4.

7. The solder paste according to claim 5, wherein the solder powder includes powder particles having a particle size of 38 μm or smaller at a ratio of 40% by mass or less based on a total amount of the solder powder, and powder particles having a particle size of greater than 38 μm at a ratio of 60% by mass or more based on a total amount of the solder powder.

8. A soldering process, comprising:
providing the solder paste according to claim 5;
introducing a reducing gas configured to reduce the solder powder; and
melting the solder powder.

9. A method for producing a soldered product, the method comprising:
applying the solder paste according to claim 5 to a soldering target,
evaporating the second solvent by heating the soldering target with the solder paste applied thereto at a temperature in a range in which the solder powder does not melt;
concurrently with or after evaporating the second solvent, reducing the solder powder and the soldering target with a reducing gas; and
after reducing the solder powder, melting the solder powder by heating the solder powder and the soldering target,
wherein the first solvent and the fatty acid amide evaporate together with the second solvent in the evaporating or evaporate as a result of the heating in the melting, whereby an absence of flux residue is achievable.

10. The method according to claim 9, wherein the evaporating comprises reducing a pressure in a space in which the soldering target is placed.

11. The method according to claim 9, wherein, in the evaporating, the soldering target is heated in a vacuum.

12. The method according to claim 9, wherein:
gaps are formed between the solder powder particles by the evaporating, and
in the reducing, the reducing gas is introduced into the gaps in a state in which the solder powder and the soldering target are disposed in a vacuum.

13. The method according to claim 9, wherein melting the solder powder is carried out by heating the solder powder and the soldering target in a vacuum to obtain an integrated solder-bonded part, the method further comprising:
after melting the solder powder, rupturing the vacuum to compress or eliminate internal cavities and voids in the solder-bonded part; and
after rupturing the vacuum, cooling the soldering target.

14. The method according to claim 9, wherein the reducing gas comprises a formic acid gas.

15. A method for producing a BGA package, the method comprising:
applying the flux according to claim 1 to a BGA package substrate as a temporal fixative temporally fixing solder balls on the applied flux;
evaporating the second solvent by heating the BGA package substrate with the flux applied thereto at a temperature in a range in which the solder balls do not melt;
concurrently with or after evaporating the second solvent, reducing the solder balls and the BGA package substrate with a reducing gas; and
after reducing the solder balls, forming solder bumps by heating the solder balls and the BGA package substrate to bond the solder balls to the BGA package substrate;
wherein the first solvent and the fatty acid amide evaporate together with the second solvent in the evaporating or evaporate as a result of the heating in the forming, whereby an absence of flux residue is achievable.

16. A method for producing a soldered product, the method comprising:
- applying the solder paste according to claim 5 to a soldering target placing solder bumps of a BGA package on the applied solder paste;
- evaporating the second solvent by heating the soldering target with the solder paste applied thereto at a temperature in a range in which the solder powder and the solder bumps do not melt;
- concurrently with or after evaporating the second solvent, reducing the solder powder, the soldering target and the solder bumps with a reducing gas; and
- after reducing the solder powder, melting the solder powder and the solder bumps by heating the solder powder, the soldering target and the solder bumps;
- wherein the first solvent and the fatty acid amide evaporate together with the second solvent or evaporate as a result of heating the solder powder when melting the solder powder, whereby an absence of flux residue is achievable.

17. The flux according to claim 1, wherein:
the first solvent is at least one selected from the group consisting of isooctadecanol, trimethylol propane, and 2,4-diethyl-1,5-pentanediol.

* * * * *